(12) United States Patent
Tomimatu

(10) Patent No.: US 6,553,137 B1
(45) Date of Patent: Apr. 22, 2003

(54) METHOD OF INCREASING OVERLAY ACCURACY IN AN EXPOSURE STEP AND OVERLAY DISPLACEMENT MEASURING DEVICE FOR DETERMINING OPTIMUM MEASUREMENT FOCUS PLANE BY VARIATION IN MAGNITUDES OF DISPLACEMENT OF TWO OVERLAY INSPECTION MARKS

(75) Inventor: Yoshikatu Tomimatu, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/372,588

(22) Filed: Aug. 12, 1999

(30) Foreign Application Priority Data

Apr. 9, 1999 (JP) ............................................. 11-102341

(51) Int. Cl.$^7$ ................................................. G06K 9/00
(52) U.S. Cl. ........................ 382/148; 382/151; 355/55
(58) Field of Search ........................ 382/141, 144–152, 382/284, 287; 355/55, 53; 250/200, 201.2; 356/399; 359/625

(56) References Cited

U.S. PATENT DOCUMENTS 5,617,340 A * 4/1997 Cresswell et al. ....... 250/491.1
5,680,200 A   10/1997 Sugaya et al. ................ 355/53

FOREIGN PATENT DOCUMENTS

JP    7-226360    8/1995
TW    11-102341   4/1999

* cited by examiner

Primary Examiner—Bhavesh Mehta
Assistant Examiner—Sheela Chawan

(57) ABSTRACT

A method of increasing overlay accuracy in an exposure step in a process of manufacturing a semiconductor device for determining a measurement focus plane enabling increase in accuracy for measuring displacement includes steps of: picking up an image of a semiconductor wafer including a plurality of chips each having first and second overlay inspection marks thereon while shifting a focus plane by a predetermined first distance in a predetermined first range with respect to a reference focus plane; calculating a variation in measured values of displacement of the first and second overlay inspection marks for each focus plane; and determining a measurement focus plane by a variations in the measured values.

10 Claims, 9 Drawing Sheets

∗···MEASURING POINT

101

101

— ● — TIS(3S)    ···VARIATION IN TIS VALUES

— ○ — M-AV-(3S) ···VARIATION IN MEASURED VALUES

— □ — MM-(3S)   ···VARIATION IN MEASURED VALUES AFTER DISPLACEMENTS ARE SUBTRACTED

METHOD OF INCREASING OVERLAY ACCURACY IN AN EXPOSURE STEP AND OVERLAY DISPLACEMENT MEASURING DEVICE FOR DETERMINING OPTIMUM MEASUREMENT FOCUS PLANE BY VARIATION IN MAGNITUDES OF DISPLACEMENT OF TWO OVERLAY INSPECTION MARKS

BACKGROUND OF THE INVENTION

1. Field of the Invention

The present invention relates to methods of increasing overlay accuracy and overlay displacement measuring devices, and more particularly to a method of increasing overlay accuracy and overlay displacement measuring device for determining a focus plane providing an optimum measuring accuracy.

2. Description of the Background Art

Recently, semiconductor devices such as ICs (Integrated Circuits) and LSIs (Large Scale Integrations) have been increasingly reduced in size. Especially, exposure devices for transferring a circuit pattern on a mask or reticle onto a circuit pattern formed on a semiconductor wafer are required to achieve increasingly high accuracy. As the degree of integration of the devices has been increased, accuracy from 0.20 μm to 0.10 μm is required, and most recently accuracy of 0.10 μm or smaller is required.

Referring to FIGS. 10 to 12B, a method of measuring overlay displacement in a conventional process of manufacturing a semiconductor device will be described.

Referring to FIG. 10, in the conventional method of measuring overlay displacement, positions of overlay inspection marks are measured at measuring points on selected ones of a plurality of chips 102 on a wafer 101. At each of the measuring points, first and second overlay inspection marks 201 and 202 are formed during patterning of an interconnection or the like as shown in FIGS. 11A and 11B. First overlay inspection mark 201 is formed on a substrate, and second overlay inspection mark 202 is formed thereon. A set 204 of first and second overlay inspection marks 201 and 202 is referred to as a Box-in-Box mark 204.

Generally, image recognition is used for measuring a magnitude of displacement of first and second overlay inspection marks 201 and 202 (a magnitude of displacement for Box-in-Box mark 204). A broadband light such as a xenon lamp is used as a light source. By detecting an intensity of the light reflected from positions near edges of first and second overlay inspection marks 201 and 202 by a camera, edge positions of first and second overlay inspection marks 201 and 202 are recognized. Distances a and b shown in FIGS. 11A are obtained, and the magnitude of displacement of first and second overlay inspection marks 201 and 202 are calculated with the following expression (1).

$$\text{Magnitude of displacement} = (a-b)/2 \quad (1)$$

Around 1991, a TIS (Tool Induced Shift) value of the magnitude of displacement would be used to increase overlay accuracy. The TIS value of displacement represents a difference between measured values of displacement for erecting and inverted images of a wafer, respectively shown in FIGS. 12A and 12B. The TIS value can be calculated with the following expression (2).

$$\text{TIS value} = (a1-b1)/2 - (a2-b2)/2 \quad (2)$$

a1, b1: distances a and b when erecting
a2, b2: distances a and b when inverted

However, when the TIS value is determined with the inspection mark which has been formed by a prescribed process, the resulting TIS value would be large. Such large TIS value has been resulted from a displaced measurement focus plane.

Then, a method of determining an optimum measurement focus plane using the TIS value had been developed by around 1993. Until now, this method has been used for determining the optimum measurement focus plane.

Now, the method of determining the measurement focus plane will be described.

A wafer 101 is loaded on a stage of an overlay displacement measuring device (not shown) for measuring a magnitude of overlay displacement. A rotational correction of wafer 101 is performed using an arrangement of a plurality of chips 102 formed on wafer 101 as a reference, and a reference point on wafer 101 is selected.

After an output level of a light source and a focus plane of a camera are set, an image of wafer 101 is incorporated.

Then, a magnitude of displacement of first and second overlay inspection marks 201 and 202 are measured in accordance with the above described method of measuring the magnitude of displacement for each of chips 102, so that the TIS value of the magnitude of displacement is obtained.

The TIS value of displacement is repeatedly determined by changing the focus plane and, for each focus plane, a 3S (3 Sigma) of the magnitude of displacement is obtained. Thereafter, the focus plane providing the minimum 3S of the TIS value is selected as the focus plane providing the highest measurement accuracy for the magnitude of displacement.

However, our examination of the above described method of determining the focus plane by 3S of the TIS value has suggested that there is not any relation between 3S of the TIS value and 3S of the measured value of displacement, as shown in FIG. 13. Therefore, even if the focus plane providing the smallest 3S of the TIS value is determined as the measurement focus plane, the magnitude of displacement is not always measured in the optimum manner.

SUMMARY OF THE INVENTION

The present invention is made to solve the aforementioned problem. An object of the present invention is to provide an overlay displacement measuring device capable of increasing accuracy for measuring a magnitude of displacement.

Another object of the present invention is to provide an overlay displacement measuring device for determining a measurement focus plane enabling increase in accuracy for measuring a magnitude of displacement.

Still another object of the present invention is to provide an overlay displacement measuring device for determining a measurement focus plane enabling increase in accuracy for measuring a magnitude of displacement in which an inspection mark having a large magnitude of displacement does not affect a variation in measured values.

Still another object of the present invention is to provide a method of increasing overlay accuracy capable of increasing accuracy for measuring a magnitude of displacement.

Still another object of the present invention is to provide a method of increasing overlay accuracy for determining a measurement focus plane enabling increase in accuracy for measuring a magnitude of displacement.

Still another object of the present invention is to provide a method of increasing overlay accuracy for determining a measurement focus plane enabling increase in accuracy for measuring a magnitude of displacement in which an inspection mark having a large magnitude of displacement does not affect a variation in measured values.

A method of increasing overlay accuracy according to one aspect of the present invention is performed in an exposure step in a process of manufacturing a semiconductor device. The above mentioned method of increasing overlay accuracy includes: a step of picking up an image of a semiconductor wafer including a plurality of chips each having first and second overlay inspection marks thereon by shifting a focus plane by a predetermined first distance in a predetermined first range with respect to a reference focus plane; a step of calculating a variation in measured values of displacement of the first and second overlay inspection marks for each focus plane; and a step of determining a measurement focus plane based on the variations in the magnitudes of displacement.

The measurement focus plane is determined by the variations in the measured values of displacement of the first and second overlay inspection marks. Unlike the conventional method using the TIS values, the focus plane is determined by using data which is directly related to the measurement of displacement. Therefore, the focus plane enabling accurate measurement of displacement of the first and second overlay inspection marks can be determined.

Preferably, the step of calculating the variation in the measured values of displacement includes: a step of calculating an average value of the measured values of displacement of the first and second overlay inspection marks for each pair of the first and second overlay inspection marks; a step of obtaining a value by subtracting the average value from the measured value for each measured value of each focus plane; and a step of calculating a variation in the values obtained by subtracting the average values from the measured values for each focus plane.

The measurement focus plane can be determined based on variations in values obtained by subtracting the average value of the measured values of displacement from the measured values of displacement. Thus, the overlay inspection mark having a large magnitude of displacement and that having a small magnitude of displacement can be equally used. As a result, accuracy for measuring the magnitude of displacement can be further increased while preventing the inspection mark having the large magnitude of displacement from affecting the variation in the measured values.

An overlay displacement measuring device according to another aspect of the present invention includes: a camera picking up an image of a semiconductor wafer including a plurality of chips each having first and second overlay inspection marks thereon; a displacement measuring portion connected to the camera for measuring a magnitude of displacement of the first and second inspection marks of each chip for each focus plane while controlling a focus of the camera; a measured value variation calculating portion connected to the displacement measuring portion for calculating a variation in measured values of displacement in each focus plane; and a measurement focus plane identifying portion connected to the measured value variation calculating portion for identifying a measurement focus plane by the variations in the measured values.

The measurement focus plane is determined by the variations in the measured values of displacement of the first and second overlay inspection marks. Unlike the conventional method using the TIS values, a focus plane is determined by using data which is directly related to the measurement of displacement. Therefore, the focus plane enabling accurate measurement of displacement of the first and second overlay inspection marks can be identified.

Preferably, the measured value variation calculating portion includes: an average value calculating portion connected to the displacement measuring portion for calculating an average value of the measured values of displacement for each pair of the first and second overlay inspection marks; a subtraction value calculating portion connected to the displacement calculating portion and the average value calculating portion for obtaining a value by subtracting the average value from the measured value for each measured value of each focus plane; and a subtraction value variation calculating portion for calculating a variation in the values obtained by subtracting average values from the measured values for each focus plane.

The measurement focus plane can be determined by the variations in the values obtained by subtracting the average value of the measured values of displacement from the measured value of displacement. Thus, the overlay inspection mark having a large magnitude of displacement and that having a small magnitude of displacement can be equally used. Therefore, accuracy for measuring the magnitude of displacement is further increased while preventing the inspection mark having the large magnitude of displacement from affecting the variation in the measured values.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
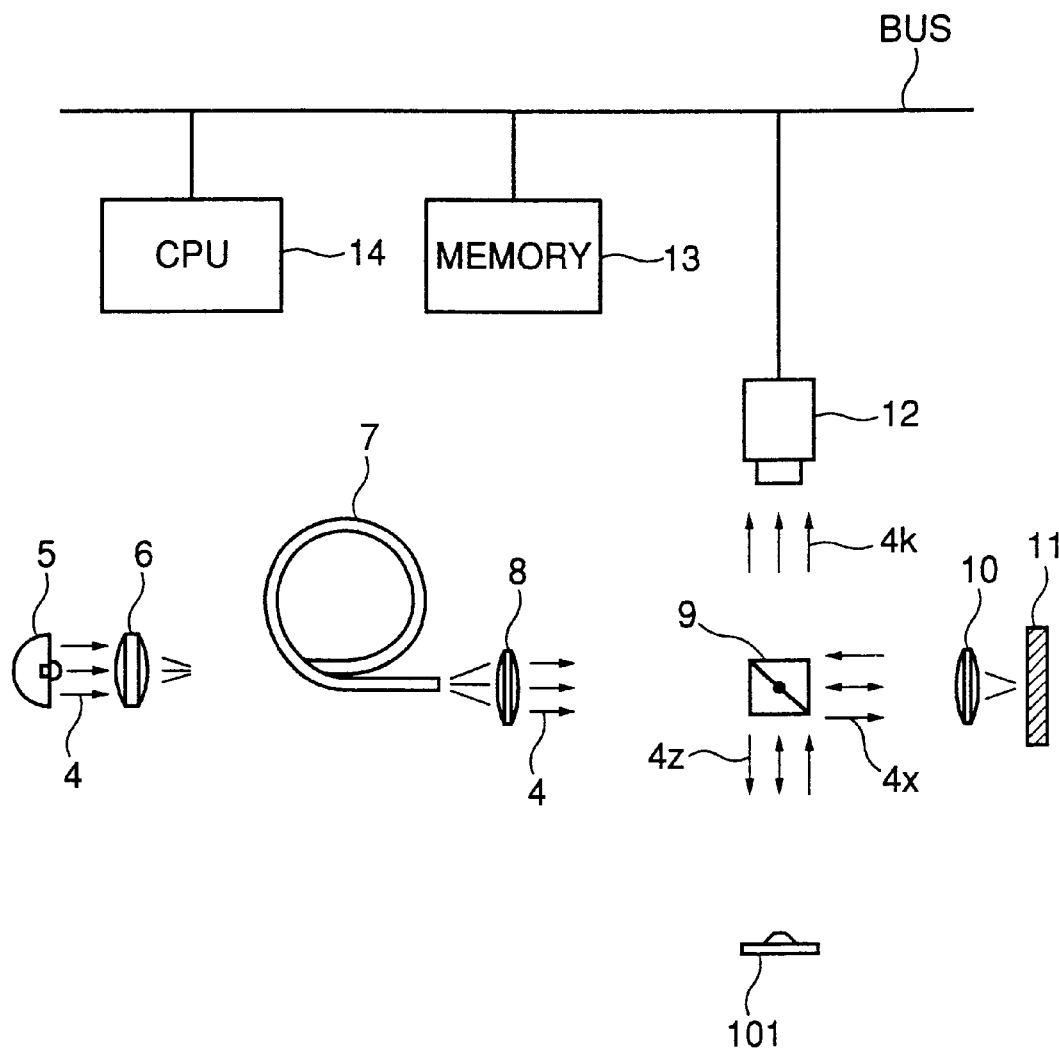
FIG. 1 is a diagram showing a structure of an overlay displacement measuring device according to an embodiment of the present invention.

Referring to FIG. 1, an overlay displacement measuring device according to one embodiment of the present invention includes: a light source 5; a lens 6 converging light (broadband light) 4 from light source 5; a fiber optic transmission device 7 passing the light converged by lens 6; a lens 8 converting the light transmitted through fiber optic transmission device 7 to collimated light; a half mirror 9 receiving light 4 from lens 8; a lens 10 receiving a portion of light 4x from half mirror 9; a mirror 11 reflecting the light transmitted through lens 10; a camera 12 receiving reflected light 4k which is the light downwardly reflected by half mirror 9 and again reflected by a wafer 101 in FIG. 1; a CPU (Central Processing Unit) 14 connected to camera 12 for increasing accuracy for measuring overlay displacement which will later be described; a memory 13 storing a program for a process to be executed by CPU 14 and other data; and a bus interconnecting CPU 14, memory 13 and camera 12.

Figure 10:
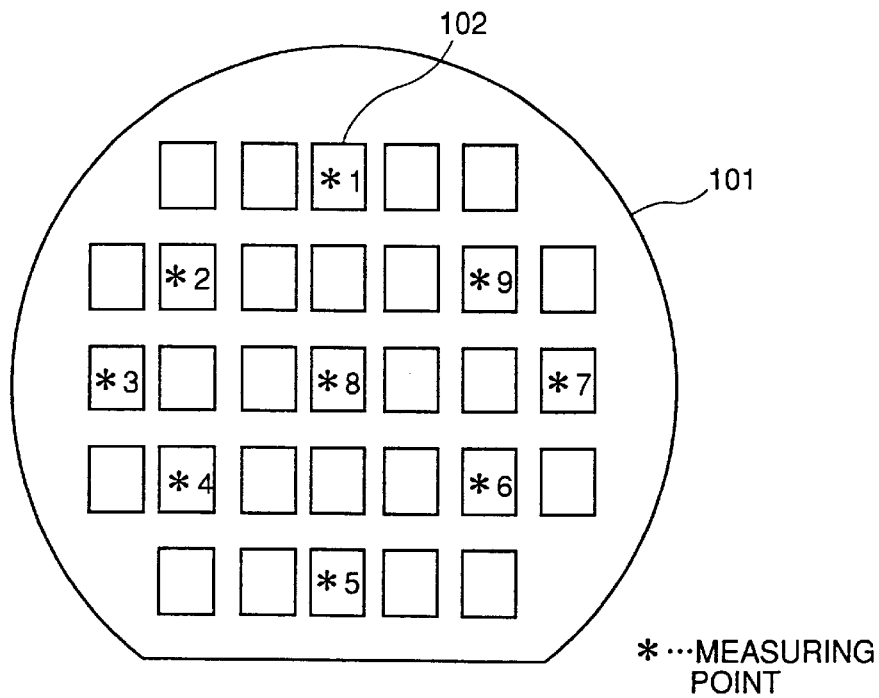
FIG. 10 is a top view showing a semiconductor wafer.
Figure 11A:
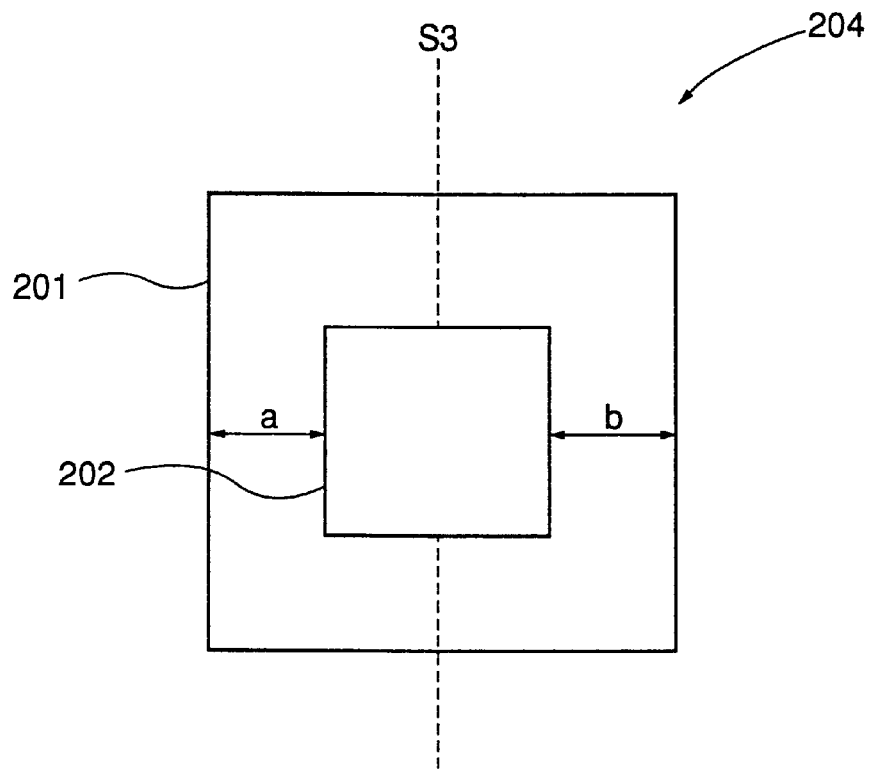
FIGS. 11A and 11B are diagrams showing overlay marks.
Figure 11B:
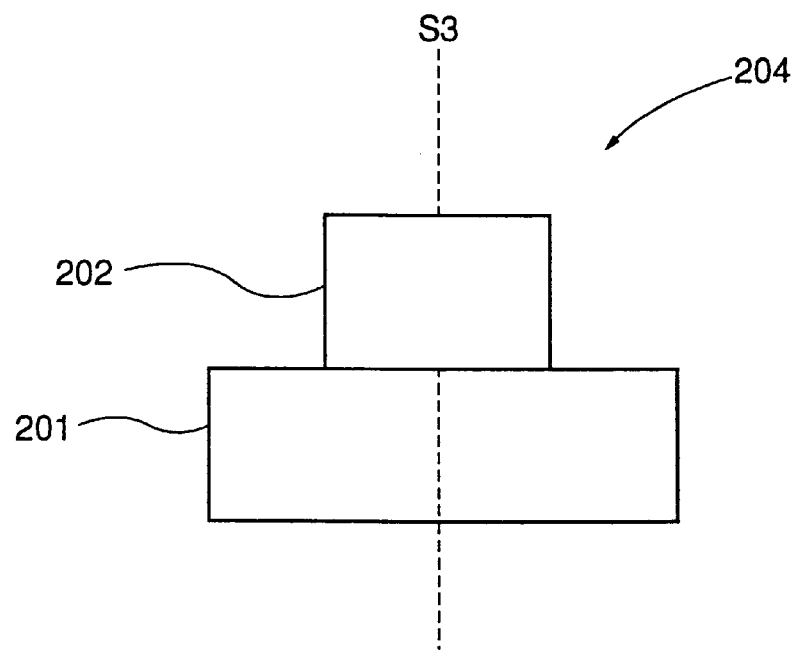
Figure 12A:
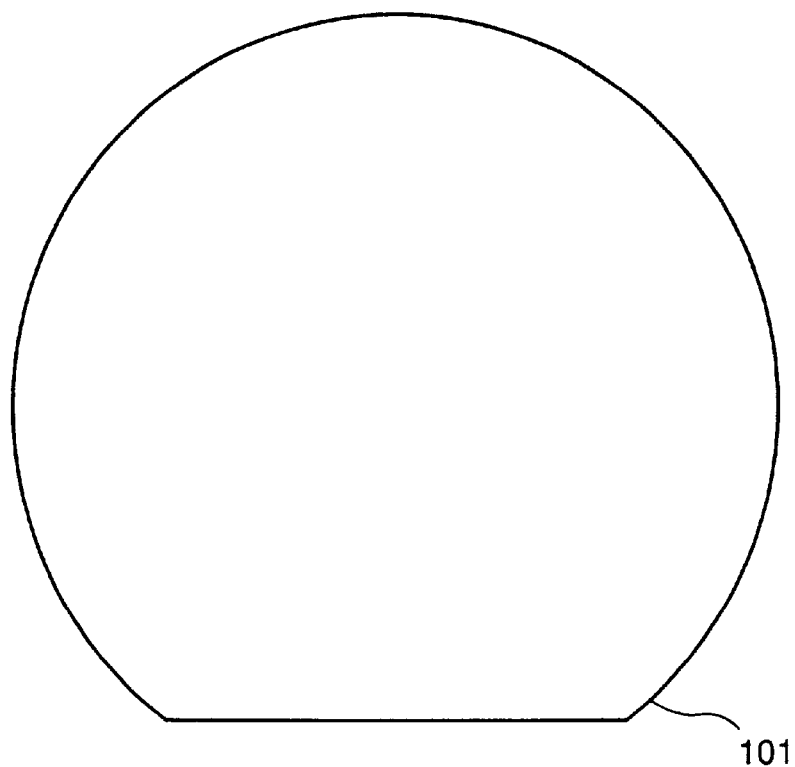
FIGS. 12A and 12B are diagrams respectively showing erecting and inverted images of a semiconductor wafer.
Figure 12B:
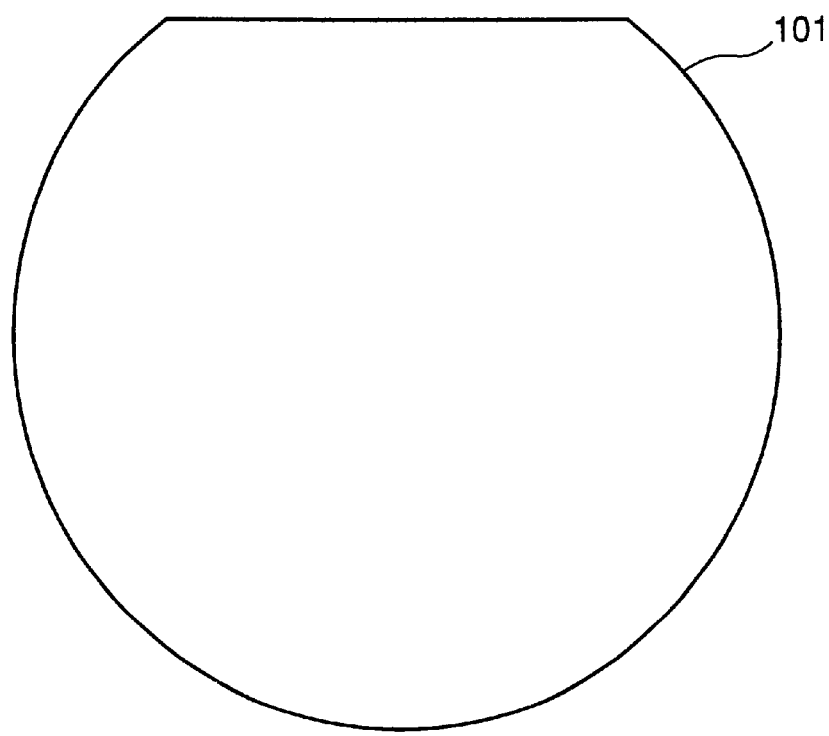
Figure 13:
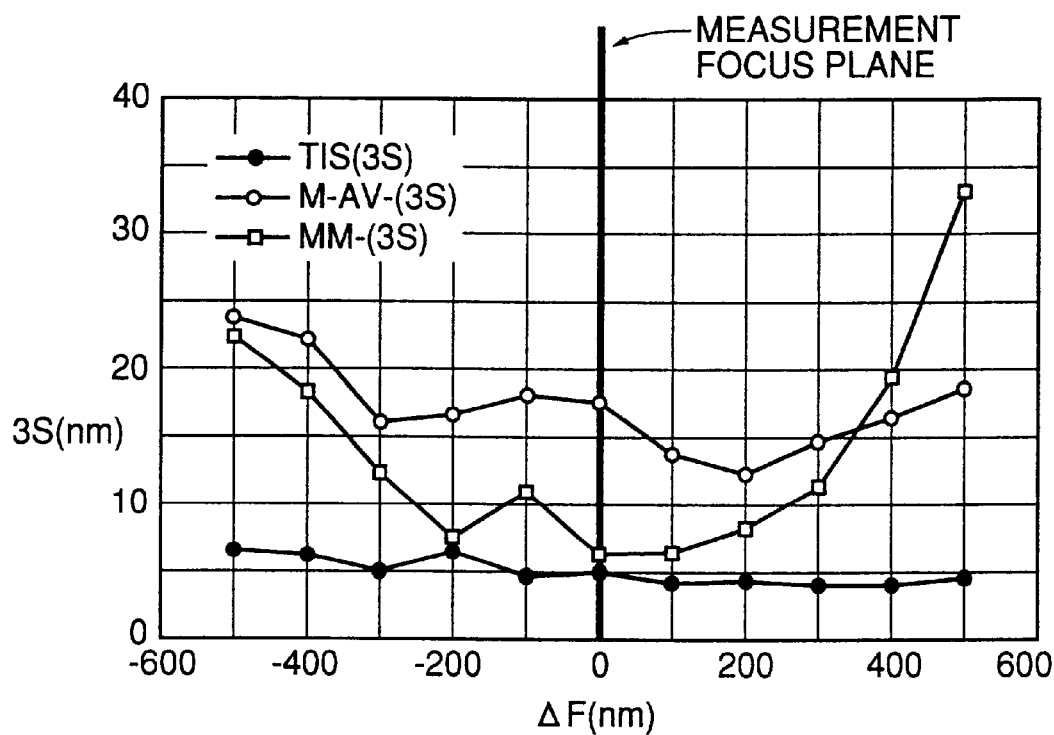
FIG. 13 is a graph used for comparison of 3S of a TIS value and that of the measured value of displacement.

As in the conventional case, wafer 101 is provided with Box-in-Box marks 204 (FIGS. 11A and 11B) on a plurality of chips 102 (FIG. 10), which will be used as measuring points.

In the overlay displacement measuring device according to the present embodiment, a magnitude of displacement for Box-in-Box mark 204 is measured as in the conventional case.

Figure 2:
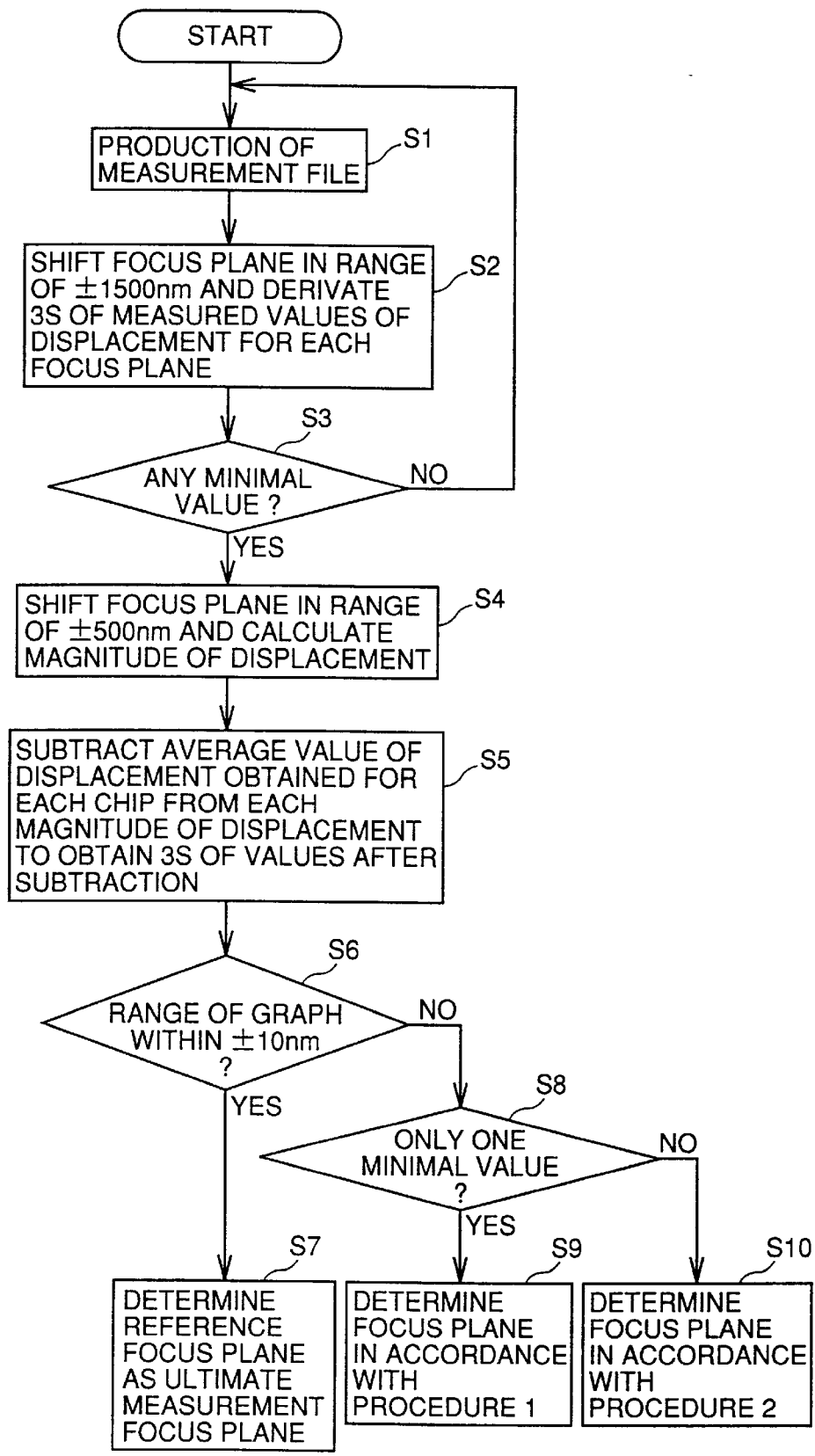
FIG. 2 is a flow chart shown in conjunction with a method of increasing accuracy for measuring overlay displacement according to the embodiment of the present invention.

Referring to FIG. 2, a method of increasing accuracy for measuring overlay displacement will be described. As in the conventional case, wafer 101 is loaded on a stage (not shown) of the overlay displacement measuring device. Rotational correction of the wafer is performed and a focus plane of camera 12 is set. CPU 14 produces a measurement file including these data in memory 13 (S1). An image of wafer 101 is picked up for each focus plane while shifting the focus plane by 300 nm in a range of ±1500 nm with respect to the focus plane which has been set in S1. A magnitude of displacement of every Box-in-Box mark 204 formed on chip 102 as the measuring point is measured for every focus plane. 3S of the measured values of displacement at the measuring point is calculated for each focus plane (S2). The resulting 3S of the measured values of displacement is shown in a graph in FIG. 3.

Figure 3:
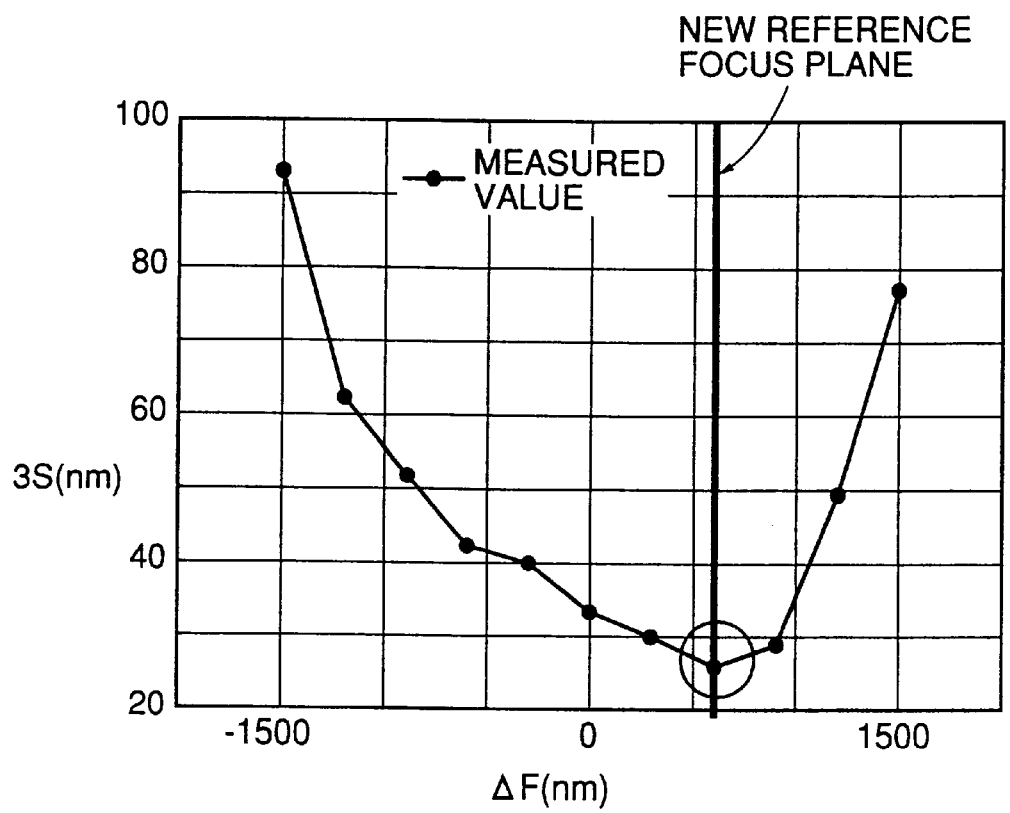
FIG. 3 is a graph showing 3S of a measured value of displacement when a focus plane is shifted by 300 nm.
Figure 4:
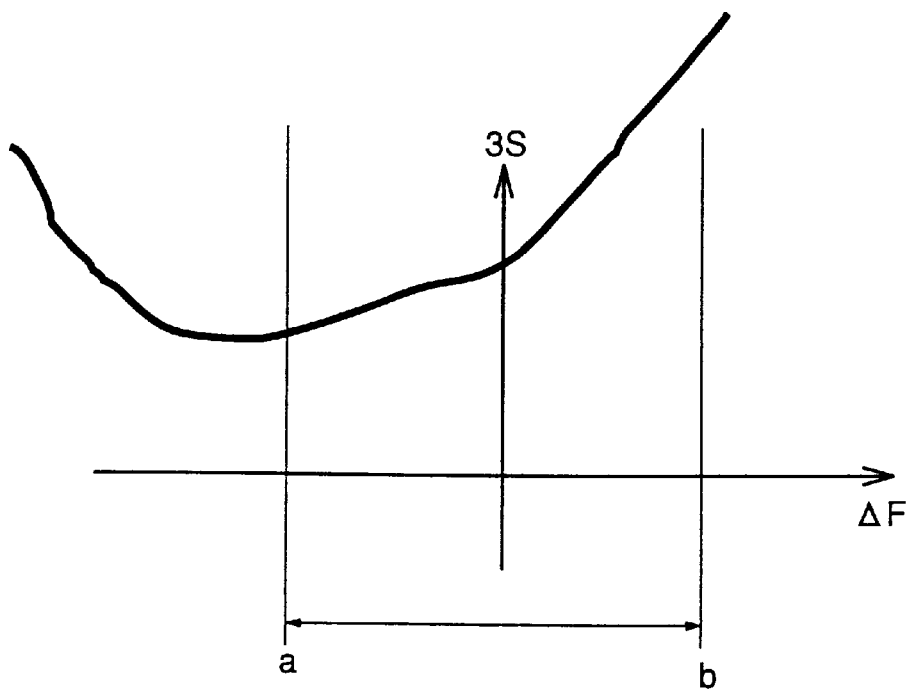
FIG. 4 is a graph not having a minimal value for 3S of the measured value of displacement.

CPU 14 determines if a minimal value is included in the graph in FIG. 3 which has been obtained by the process in S2 (S3). If there is not the minimal value in the graph (NO in S3), the process returns to S1, and CPU 14 newly sets a focus plane and repeats the processes in S1 and S2 until the minimal value is obtained. More specifically, referring to FIG. 4, when there is not the minimal value in the measurement range (a range between a and b in the drawing), CPU 14 resets the focus plane for determining a new measurement range.

If there is the minimal value in the graph (YES in S3), the focus plane related to the minimal value is determined as a reference focus plane, the focus plane is shifted by 100 nm in a range of ±500 nm with respect to the reference focus plane, and the image of wafer 101 is picked up for each focus plane. A magnitude of displacement for every Box-in-Box mark 204 formed on chip 102, which is to be a measuring point, is measured for each focus plane (S4). An average value of the measured values of displacement is calculated for each focus plane. For Box-in-Box mark 204 of each focus plane, a value (hereinafter referred to as a D1 value) is obtained by subtracting the average value of the measured values of displacement from the measured value of displacement of Box-in-Box mark 204. 3S of the D1 values is calculated for each focus plane (S5).

Figure 5:
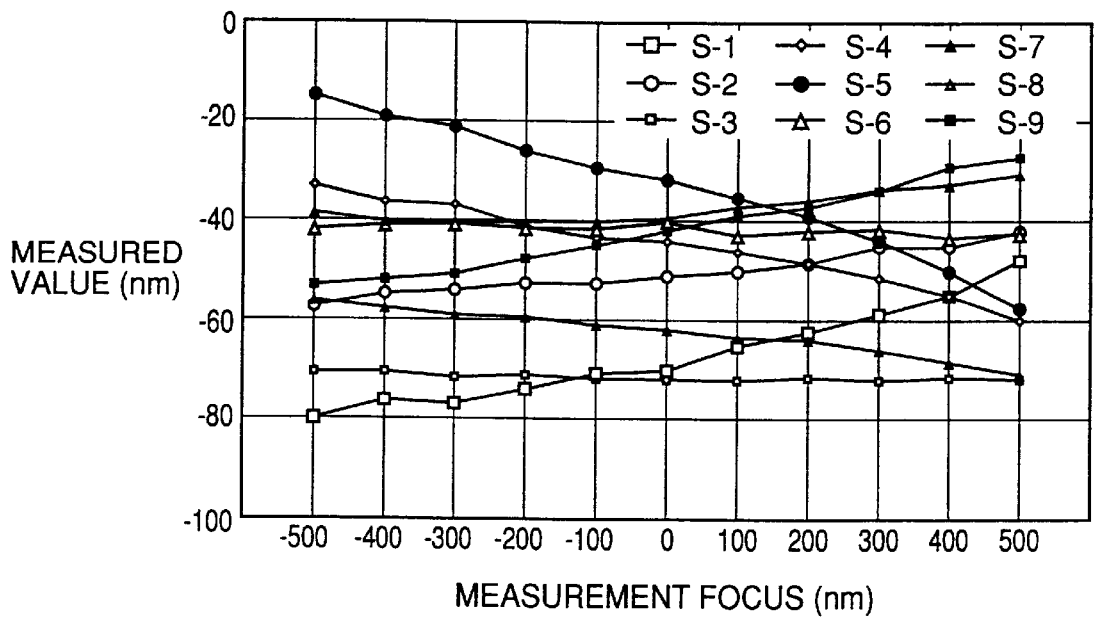
FIG. 5 is a diagram showing a relation between a measurement focus and the measured value of displacement for every chip.

Referring to FIG. 5, when the magnitude of displacement of first and second overlay inspection marks 201 and 202 is originally large, a variation in the measured values tends to be also large. As a result, Box-in-Box mark 204 originally having a large displacement may disadvantageously affect 3S of the measured values of displacement. To avoid such problem, the D1 value is used which is obtained by eliminating a direct current component from the measured value of displacement.

Figure 6:
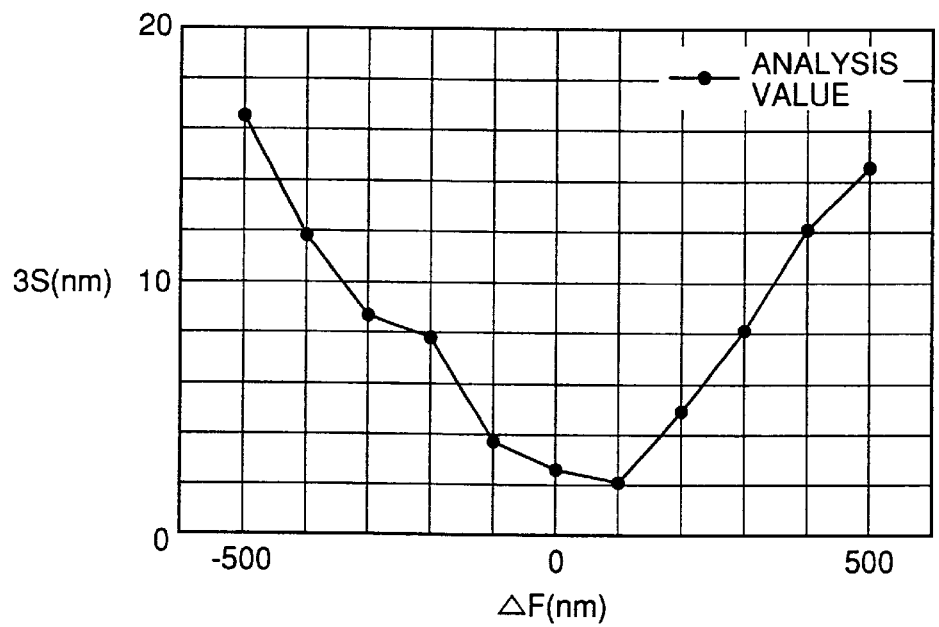
FIG. 6 is a graph showing 3S of a D1 value.

A graph showing 3S of the D1 value is shown in FIG. 6. When 3S of the D1 values is within a range of ±10 nm (YES in S6), the reference focus plane obtained by S2 and S3 is determined as an ultimate measurement focus plane (S7). 3S of the measured values of displacement can be expressed in the following expression (3).

$$3S \text{ of measured values} = (3S \text{ of errors})^2 + (3S \text{ of true magnitudes of displacement})^2 \quad (3)$$

3S of true magnitudes of displacement is generally about 30 nm. Therefore, to permit about 10% of measurement error so as to achieve 3S of the measured values of about 33 nm, 3S of the errors may be about ±10 nm. Thus, the above described numerical value of ±10 nm is used.

When the range of 3S of the D1 values is wider than ±10 nm (NO in S6), the number of minimal values of 3S of the D1 values in the graph is determined (S8). When there is only one minimal value (YES in S8), the ultimate measurement focus plane is determined in accordance with a first procedure which will later be described (S9). When there are two or more minimal values (NO in S8), the ultimate measurement focus plane is determined in a second procedure which will later be described.

Figure 7:
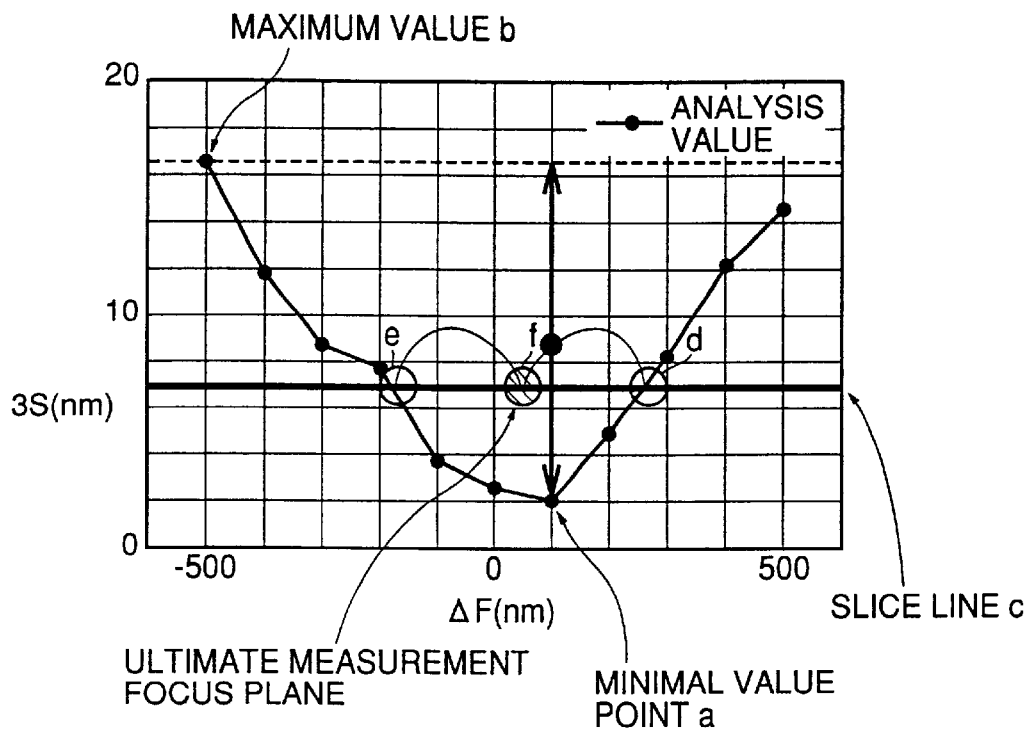
FIG. 7 is a diagram shown in conjunction with a method of determining a measurement focus plane in accordance with a first procedure.
Figure 8:
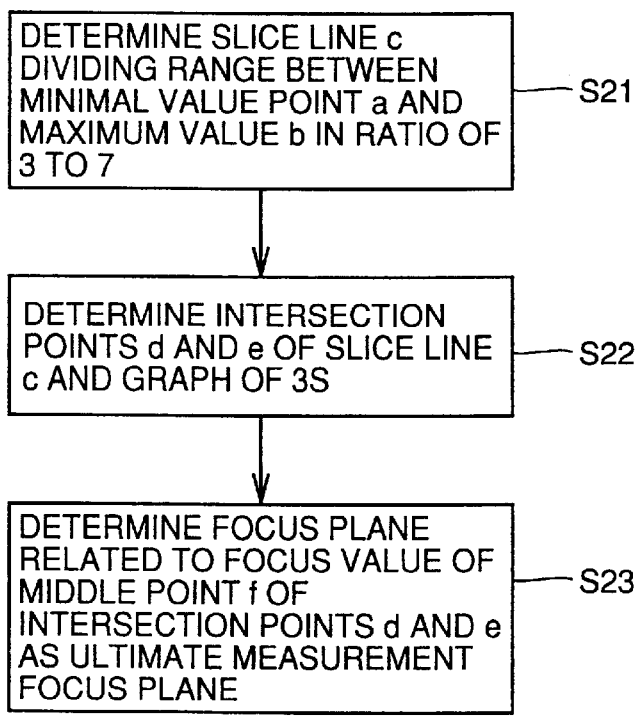
FIG. 8 is a flow chart showing the first procedure.

Referring to FIGS. 7 and 8, the first procedure will be described. A slice line c dividing a range between a minimal value point a and a maximum value b in the graph for 3S in the ratio of 3 to 7 is determined (S21). Intersection points d and e of slice line c and the graph for 3S are determined (S22). The focus plane related to a focus value for a middle point f of intersection points d and e is determined as the ultimate measurement focus plane (S23).

Figure 9:
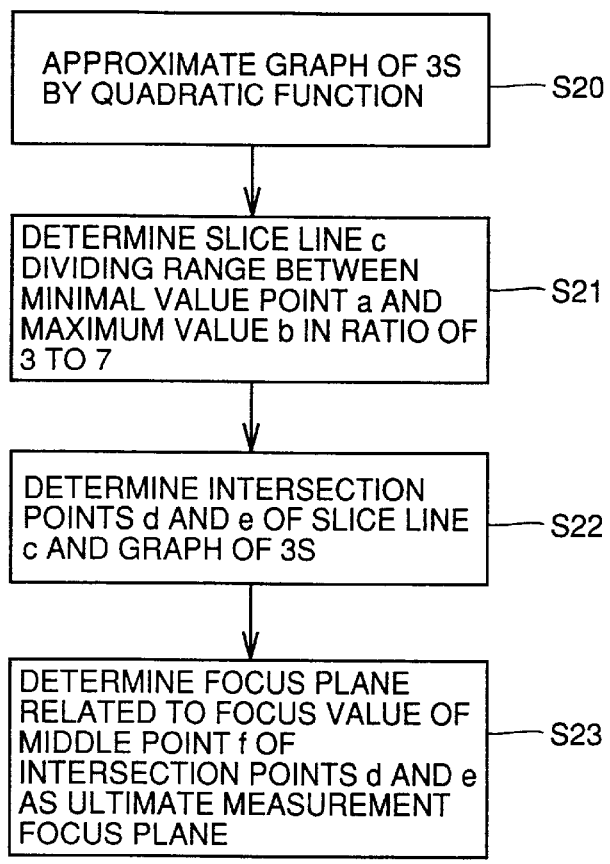
FIG. 9 is a flow chart showing a second procedure.

Referring to FIG. 9, the second procedure will be described. The graph for 3S is approximated to the most similar quadratic function (S20). Based on the graph which has been approximated to the quadratic function, the ultimate measurement focus plane is determined in a method similar to the first procedure which has been described with reference to FIGS. 7 and 8 (S21 to S23).

Thus, by determining the ultimate measurement focus plane using 3S of the measured values of displacement, the focus plane can be determined by using data which is directly related to the measurement of the magnitude of displacement. As a result, a variation in the measured values is minimized and accuracy for measuring the magnitude of displacement can be increased by measuring the magnitude of displacement of Box-in-Box mark 204 in the determined ultimate measurement focus plane.

In addition, the overlay inspection mark having a large magnitude of displacement and that having a small magnitude of displacement can be equally used as the measurement focus plane is determined by the variation in the D1 values. Therefore, the inspection mark having the large magnitude of displacement does not affect the variation in the measured values, so that further increase in accuracy for measuring the magnitude of displacement can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of increasing overlay accuracy in an exposure step in a process of manufacturing a semiconductor device, comprising the steps of:

picking up an image of a semiconductor wafer including a plurality of chips each having first and second overlay inspection marks thereon by shifting a focus plane by a predetermined first distance in a predetermined first range with respect to a reference focus plane;

calculating a variation in measured values of displacement of said first and second overlay inspection marks for each focus plane;

determining a measurement focus plane based on said variations in the measured values;

picking up the image of said semiconductor wafer while shifting the focus plane by a second distance greater than said first distance in a predetermined second range; and calculating a variation in the measured values of displacement of said first and second overlay inspection marks for said each focus plane for determining the focus plane producing a minimum variation of said measured values as said reference focus plane, said step of determining said measurement focus plane including the steps of:

determining said reference focus plane as said measurement focus plane when a range of said variations in the measured values calculated for each focus plane in said first range is at most a predetermined first value;

determining said measurement focus plane in accordance with a first procedure allowing, when said range of said variations in the measured values calculated for each focus plane in said first range is greater than said first value and when there is only one minimal value in a graph defining an abscissa as a focus value and an ordinate as said variation in the measured values, determination of a slice line parallel to said abscissa dividing an interval between said minimal value and a maximum value of said variations in the measured values in said graph in a prescribed ratio, determination of two points at which said slice line and said graph intersect, and determination of a value at an intermediate point between said two points along said abscissa as said measurement focus plane; and determining said measurement focus plane in accordance with said first procedure after approximating said graph by a quadratic function when said range of said variations in the measured values calculated for each focus plane in said first range is greater than said first value and when there are a plurality of minimal values in said graph.

2. The method of increasing overlay accuracy according to claim 1, wherein said variation in the measured values is a 3 sigma value of said measured values.

3. The method of increasing overlay accuracy according to claim 1, wherein said step of calculating said variation in the measured values includes:

calculating an average value of measured values of displacement of said first and second overlay inspection marks for each pair of said first and second overlay inspection marks;

obtaining a value by subtracting said average value from said measured value for each measured value of said each focus plane; and calculating a variation in the values obtained by subtracting said average values from said measured values for said each focus plane.

4. The method of increasing overlay accuracy according to claim 3, wherein said variation in the values obtained by subtracting said average values from said measured values is a 3 sigma value of the values obtained by subtracting said average values from said measured values.

5. The method of increasing overlay accuracy according to claim 1, wherein said variation in the measured values is a 3 sigma value of said measured values.

6. A method of increasing overlay accuracy in an exposure step in a process of manufacturing a semiconductor device, comprising the steps of:

picking up an image of a semiconductor wafer including a plurality of chips each having first and second overlay inspection marks thereon by shifting a focus plane by a predetermined first distance in a predetermined first range with respect to a reference focus plane;

calculating a variation in measured values of displacement of said first and second overlay inspection marks for each focus plane; and determining a measurement focus plane based on said variations in the measured values, wherein said step of calculating said variation in the measured values includes:

calculating an average value of measured values of displacement of said first and second overlay inspection marks for every one of said first and second overlay inspection marks;

obtaining a value by subtracting said average value from said measured value for each measured value of each focus plane; and calculating a variation in the values obtained by subtracting said average value from said measured values for said each focus plane.

7. The method of increasing overlay accuracy according to claim 6, wherein a variation in the values obtained by subtracting said average values from said measured values is a 3 sigma value of the values obtained by subtracting said average values from said measured values.

8. An overlay displacement measuring device, comprising:

a camera picking up an image of a semiconductor wafer including a plurality of chips each having first and second overlay inspection marks thereon;

a displacement measuring portion connected to said camera for measuring a magnitude of displacement of said first and second overlay inspection marks for every chip in each focus plane while controlling a focus of said camera;

measured value variation calculating portion connected to said displacement measuring portion for calculating a variation in said measured values of displacement for said each focus plane; and a measurement focus plane identifying portion connected to said measured value variation calculating portion for identifying a measurement focus plane by said variations in the measured values, wherein said measured value variation calculating portion includes:

an average value calculating portion connected to said displacement measuring portion for calculating an average value of said measured values of displacement for each pair of said first and second overlay inspection marks;

a subtraction value calculating portion connected to said displacement calculating portion and said average value calculating portion for obtaining a value by subtracting said average value from said measured value for each measured value of each focus plane; and a subtraction value variation calculating portion for calculating a variation in the values obtained by subtracting said average value from said measured values for said each focus plane.

9. The overlay displacement measuring device according to claim 8, wherein said variation in the measured values is a 3 sigma value of said measured values.

10. The overlay displacement measuring device according to claim 8, wherein said variation in the values obtained by subtracting said average values from said measured values is a 3 sigma value of the values obtained by subtracting said average values from said measured values.

\* \* \* \* \*